United States Patent
Ogihara et al.

(10) Patent No.: US 6,313,483 B1
(45) Date of Patent: Nov. 6, 2001

(54) LIGHT-EMITTING SEMICONDUCTOR DEVICE WITH REDUCED NONRADIATIVE RECOMBINATION

(75) Inventors: Mitsuhiko Ogihara; Hiroshi Hamano; Masumi Taninaka, all of Tokyo (JP)

(73) Assignee: Oki Data Communication, Tokyo (JP)

( * ) Notice: Subject to any disclaimer, the term of this patent is extended or adjusted under 35 U.S.C. 154(b) by 0 days.

(21) Appl. No.: 09/312,848

(22) Filed: May 17, 1999

(30) Foreign Application Priority Data

Jul. 1, 1998 (JP) .................................................. 10-186161

(51) Int. Cl.[7] .................................................. H01L 27/15
(52) U.S. Cl. .................................. 257/79; 257/95; 257/81; 257/82; 257/83; 257/84; 257/102; 257/184; 372/45
(58) Field of Search ................................ 257/95, 79, 81, 257/82, 83, 84, 102, 184; 372/45

(56) References Cited

U.S. PATENT DOCUMENTS

| | | | |
|---|---|---|---|
| 4,942,439 | | 7/1990 | Schairer . |
| 5,038,185 | * | 8/1991 | Thronton .................................. 357/17 |
| 5,048,040 | * | 9/1991 | Paoli ........................................ 372/50 |
| 5,157,680 | * | 10/1992 | Goto ........................................ 372/50 |
| 5,189,496 | * | 2/1993 | Kuwabara ................................ 257/79 |
| 5,262,353 | * | 11/1993 | Sun et al. ............................... 437/195 |
| 5,293,392 | * | 3/1994 | Shieh et al. ............................. 372/45 |
| 5,317,170 | * | 5/1994 | Paoli ........................................ 257/88 |
| 5,404,370 | * | 4/1995 | Otsubo et al. .......................... 372/45 |
| 5,499,260 | * | 3/1996 | Takahashi et al. ...................... 372/46 |
| 5,742,631 | * | 4/1998 | Paoli ........................................ 372/50 |
| 5,818,861 | * | 10/1998 | Tan et al. ................................ 372/46 |

* cited by examiner

*Primary Examiner*—Eddie Lee
*Assistant Examiner*—Eugene Lee
(74) *Attorney, Agent, or Firm*—Venable; Robert J. Frank; Michael A. Sartori

(57) ABSTRACT

A light-emitting semiconductor device has a semi-insulating semiconductor surface layer overlying a conductive semiconductor layer of a first conductive type. A diffusion region of a second conductive type extends through the semi-insulating semiconductor surface layer and ends in the conductive semiconductor layer. Positive and negative electrode contacts are provided on the upper surface of the device. Nonradiative recombination near the surface of the device is reduced because there is no pn junction in the semi-insulating semiconductor surface layer, and the device structure is suitable for matrix driving.

19 Claims, 11 Drawing Sheets

LIGHT-EMITTING SEMICONDUCTOR DEVICE WITH REDUCED NONRADIATIVE RECOMBINATION

BACKGROUND OF THE INVENTION

The present invention relates to a light-emitting semiconductor device such as a light-emitting diode.

A conventional light-emitting diode, referred to below as an LED, is formed by selective diffusion of a p-type impurity into an n-type semiconductor substrate. FIG. 1 shows an example In which the semiconductor substrate 10 comprises an n-type gallium-arsenide (GaAs) substrate layer 11 and an n-type gallium-arsenide-phosphide (GaAsP) epitaxial layer 12. Selective diffusion of zinc (Zn) creates a p-type diffusion region 14. The device is covered with an insulating film 15 in which a window is opened to permit a p-electrode 16 to make contact with the diffusion region 14. An n-electrode 17 is formed on the underside of the device, in contact with the n-type GaAs substrate 11. When a forward voltage is applied between the p-electrode 16 and n-electrode 17, light is emitted by radiative recombination of electrons and holes in the vicinity of the pn junction formed between the p-type diffusion region 14 and the n-type GaAsP epitaxial layer 12.

Nonradiative recombination also occurs, especially near the surface of the device, due to crystal defects present near the surface.

FIG. 2 shows a variation of this device in which the semiconductor substrate 20 has three epitaxial layers: an n-type $GaAs_{1-x}P_x$ graded buffer layer 21 in which the phosphorus concentration (the value of x) gradually increases in the upward direction; an n-type $GaAs_{1-y}P_y$ layer 22 in which the phosphorus concentration (y) is constant; and an n-type $GaAs_{1-z}P_z$ layer 23 in which the phosphorus concentration (z) is constant and is greater than the concentration (y) in the $GaAs_{1-y}P_y$ layer 22. The p-type zinc diffusion 24 extends through the $GaAs_{1-z}P_z$ layer 23 into the $GaAs_{1-y}P_y$ layer 22. Because of the different phosphorus concentrations, light emitted in the $GaAs_{1-y}P_y$ layer 22 is not absorbed in the $GaAs_{1-z}P_z$ layer 23, so light emission is increased.

A problem in these conventional LEDs is that the p-type impurity (zinc) diffuses laterally as well as vertically, and near the surface of the device, the lateral diffusion is irregular. In the device in FIG. 2, in particular, the diffusion front becomes extremely irregular on a microscopic scale at the interface between the $GaAs_{1-z}P_z$ layer 23 and the $GaAs_{1-y}P_y$ layer 22. The irregularities create strong electric field pockets, so that when a forward voltage is applied, much of the forward current is channeled across the pn junction at points near the surface (in the $GaAs_{1-z}P_z$ layer 23 in FIG. 2, for example), where nonradiative recombination is most likely to occur. The light-emitting efficiency of the device is thereby reduced.

SUMMARY OF THE INVENTION

An object of the present invention is to increase the efficiency of a light-emitting semiconductor device by reducing nonradiative recombination.

A light-emitting semiconductor device according to a first aspect of the invention is formed in a semiconductor substrate having a conductive semiconductor layer of a first conductive type, and a semi-insulating semiconductor surface layer adjacent the conductive semiconductor. A first diffusion region, of a conductive type opposite to the first type, is formed in both of these layers, the depthwise diffusion front ending in the conductive semiconductor layer. A second diffusion region, of the first conductive type, is also formed, extending through the semi-insulating semiconductor surface layer at least to the interface between that layer and the conductive semiconductor layer. A first electrode forms an ohmic contact with the first diffusion region. A second electrode forms an ohmic contact with the second diffusion region.

A light-emitting semiconductor device according to a second aspect of the invention is similar, but the semi-insulating semiconductor surface layer is etched, leaving only an island disposed in the first diffusion region, and no second diffusion region is provided. The second electrode forms an ohmic contact directly with the conductive semiconductor layer.

The invention also provides arrays of light-emitting semiconductor devices of the above types, and in particular, matrix-driven arrays.

Since the semi-insulating semiconductor surface layer has no pn junction, recombination tends not to occur near the surface of the device. Nonradiative recombination is thereby reduced.

DETAILED DESCRIPTION OF THE INVENTION

Figure 1:
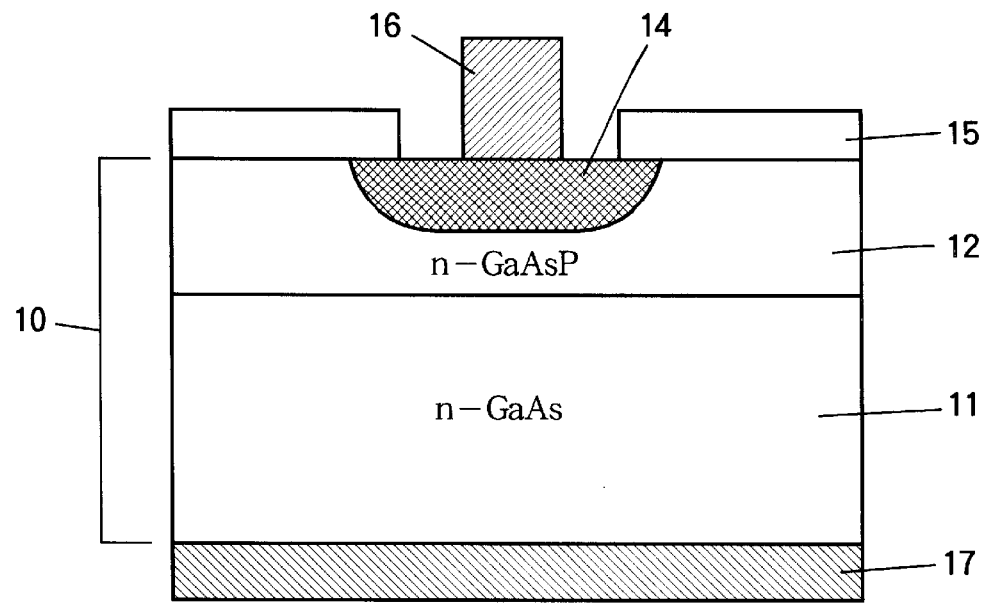
FIG. 1 is a sectional diagram of a conventional LED.

Embodiments of the invention will be described with reference to the attached drawings, in which like parts are identified by like reference characters. The embodiments will be LED arrays comprising a plurality of light-emitting regions formed on a single semiconductor substrate, but the invention is also applicable to light-emitting devices having a single light-emitting region.

Figure 3:
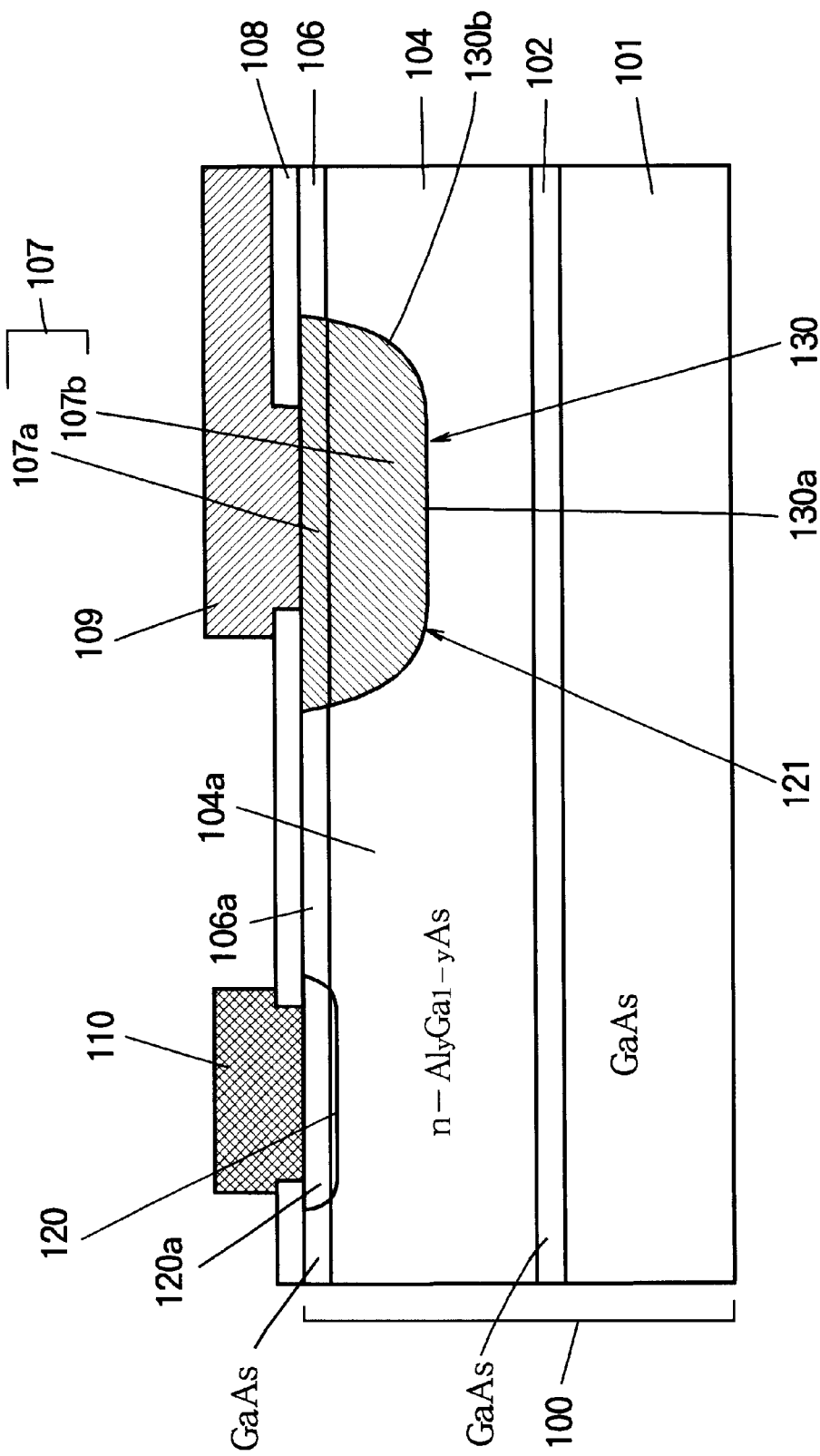
FIG. 3 is a sectional view of a light-emitting semiconductor device illustrating a first embodiment of the invention.

Referring to FIG. 3, the semiconductor substrate 100 in the first embodiment comprises, from bottom to top, a semiinsulating GaAs substrate layer 101, a semi-insulating GaAs buffer layer 102, a conductive n-type $Al_yGa_{1-y}As$ layer 104, and a semi-insulating GaAs surface layer 106. The GaAs buffer layer 102, $Al_yGa_{1-y}As$ layer 104, and GaAs surface layer 106 are epitaxial layers. The thickness of the GaAs surface layer 106 is, for example, five hundred angstroms (500 Å).

The semi-insulating epitaxial layers 102 and 106 may be intrinsic semiconductor layers or non-doped layers. A non-doped layer need not be perfectly intrinsic, but may be an n-type or p-type layer with a low carrier concentration. A semi-insulating layer may also be created by compensatory doping. In any case, the semi-insulating layers 102 and 106 have a high resistivity, on the order of ten million ohm-centimeters ($10^7$ Ωcm).

Selective solid-phase or vapor-phase diffusion of zinc, carried out from the upper surface of the semiconductor substrate 100, creates a p-type diffusion region 107 comprising a gallium-arsenide-zinc (GaAs—Zn) diffusion region 107a disposed in the GaAs surface layer 106, and an aluminum-gallium-arsenide-zinc ($Al_yGa_{1-y}As$—Zn) diffusion region 107b disposed in the $Al_yGa_{1-y}As$ layer 104. The p-type diffusion region 107 has a diffusion front 130 disposed partly in the $Al_yGa_{1-y}As$ layer 104 and partly in the GaAs surface layer 106. After the diffusion, the $Al_yGa_{1-y}As$ layer 104 comprises an n-type part 104a and a p-type part 107b. A pn junction 121 is formed at the depthwise diffusion front 130a, and also at the part of the lateral diffusion front 130b disposed in the $Al_yGa_{1-y}As$ layer 104.

In addition, selective solid-phase or vapor-phase diffusion of an n-type impurity such as tin (Sn) or silicon (Si) is performed from the upper surface of the semiconductor substrate 100 to create an n-type diffusion region 120, which extends through the GaAs surface layer 106 at least to the interface between the $Al_yGa_{1-y}As$ layer 104 and the GaAs surface layer 106. In the drawing, the depthwise diffusion front of the n-type diffusion region 120 is disposed just below the interface between these layers 104 and 106, but this is not a restriction; the diffusion may proceed deeper into the $Al_yGa_{1-y}As$ layer 104.

After these diffusions, the GaAs surface layer 106 comprises a semi-insulating part 106a, a p-type part 107a, and an n-type part 120a. No pn junction is formed in the GaAs surface layer 106, because the p-type part 107a and n-type part 120a are separated by the semi-insulating part 106a.

The surface of the semiconductor substrate 100 is covered by an inter-layer insulating film 108 of, for example, silicon nitride (SiN). The inter-layer insulating film 108 is patterned so that the entire semi-insulating part 106a of the GaAs surface layer 106, and the outer parts of the p-type diffusion region 107a and n-type diffusion region 120a, are left covered, but the main parts of the p-type diffusion region 107a and n-type diffusion region 120a are exposed.

An aluminum p-electrode 109 is formed on the interlayer insulating film 108, making ohmic contact with the exposed part of the p-type diffusion region 107a. A gold alloy n-electrode 110 is also formed on the inter-layer insulating film 108, making ohmic contact with the exposed part of the n-type diffusion region 120a. The structure comprising the p-electrode 109, the p-type diffusion region 107, the n-type semiconductor regions (the n-type $Al_yGa_{1-y}As$ layer 104a and the n-type diffusion region 120a), and the n-electrode 110 forms one LED.

Figure 4:
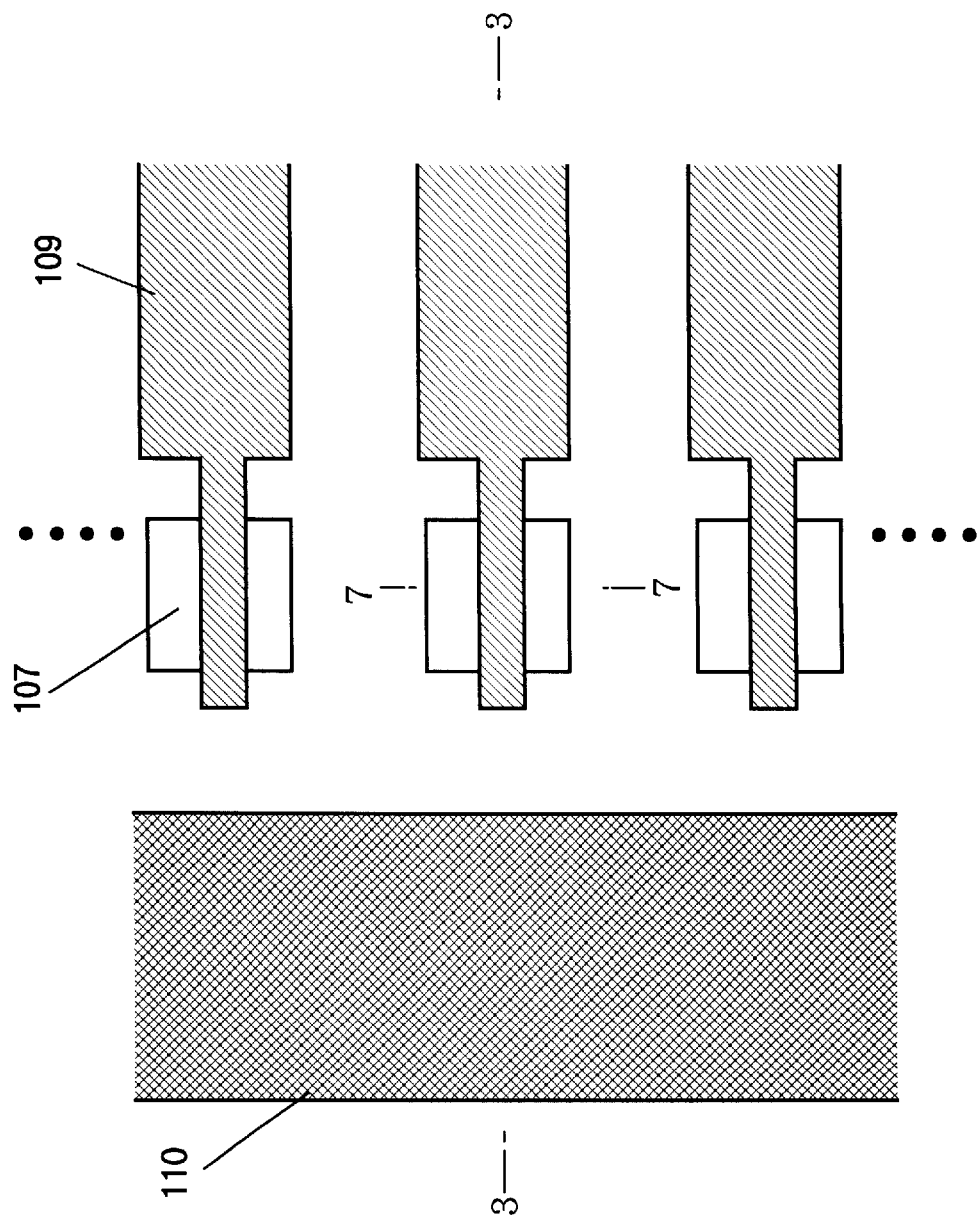
FIG. 4 is a plan view of the first embodiment.

FIG. 4 is a plan view of part of the first embodiment, which is a linear array of LEDs. Each LED has a separate p-type diffusion region 107 and p-electrode 109, but the n-electrode 110 and the n-type semiconductor regions are shared by a plurality of LEDs. FIG. 3 is a sectional view through line 3—3 in FIG. 4.

Next, the operation of the first embodiment, will be described.

When a forward voltage is applied between the p-electrode 109 and n-electrode 110, minority carriers are injected across the pn junction 121, electrons being injected into the p-type diffusion region 107 and holes into the n-type $Al_yGa_{1-y}As$ layer 104a. Recombination of these minority carriers with majority carriers generates light having an energy equivalent to the band-gap energy of the $Al_yGa_{1-y}As$ layer 104. The band-gap energy of the $Al_yGa_{1-y}As$ layer 104 is determined mainly by the aluminum composition ratio (y). The wavelength of the light is proportional to the band-gap energy, and is thus determined by the value of The band-gap energy of the GaAs surface layer 106 is less than the band-gap energy of the $Al_yGa_{1-y}As$ layer 104, so some of the light emitted in the $Al_yGa_{1-y}As$ layer 104 is absorbed during passage through the GaAs surface layer 106, more precisely the GaAs—Zn diffusion region 107a, but because of the thinness of this layer, the amount of absorption is small. Some light is also reflected by the p-electrode 109, but most of the light that passes through the GaAs—Zn diffusion region 107a misses the p-electrode 109 and is emitted through the inter-layer insulating film 108, which is transparent.

Figure 2:
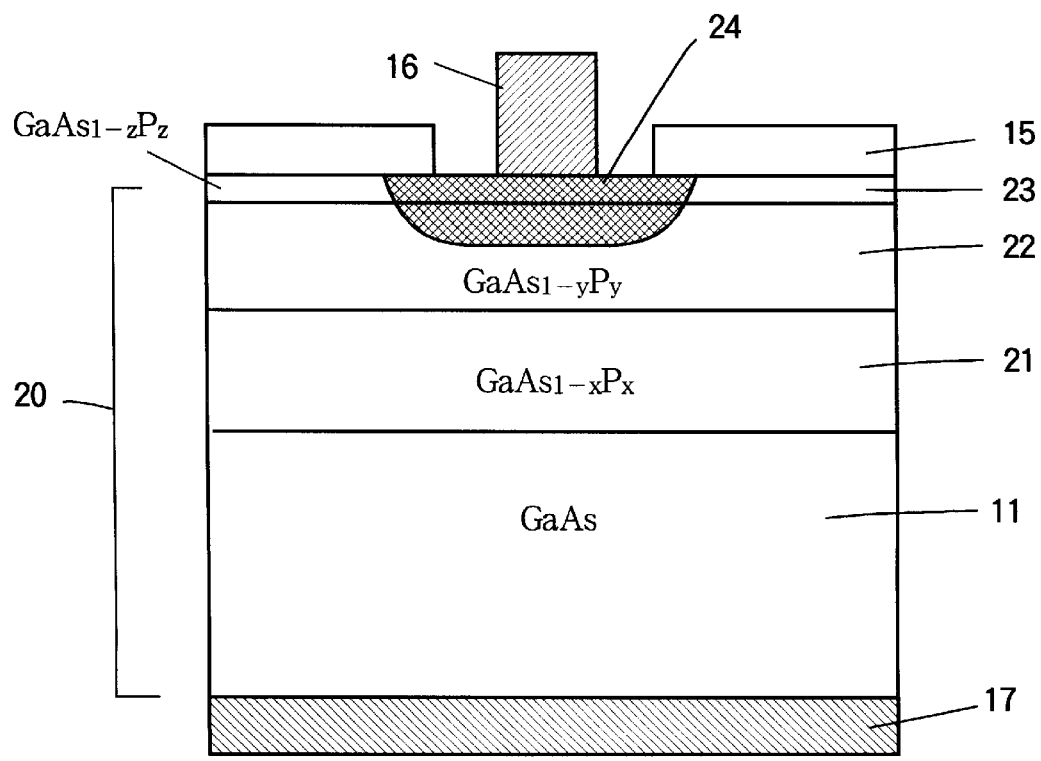
FIG. 2 is a sectional diagram of another conventional LED.

The amount of light emitted depends on the amount of forward current and the relative proportions of radiative and nonradiative recombination. In the first embodiment, substantially none of the forward current flows from the GaAs—Zn diffusion region 107a into the semi-conducting GaAs surface layer 106a, because of the lack of carriers in the semi-conducting GaAs surface layer 106a. Compared with, for example, the conventional device in FIG. 2, in which the uppermost semiconductor layer is an n-type layer, the first embodiment forces more current to flow through the deeper pn junction in the $Al_yGa_{1-y}As$ layer 104, where carrier recombination is more likely to be radiative. For a given forward current, the first embodiment accordingly generates more light. The first embodiment also provides good control over the wavelength of the emitted light, which is determined by a single composition parameter (y).

Figure 5:
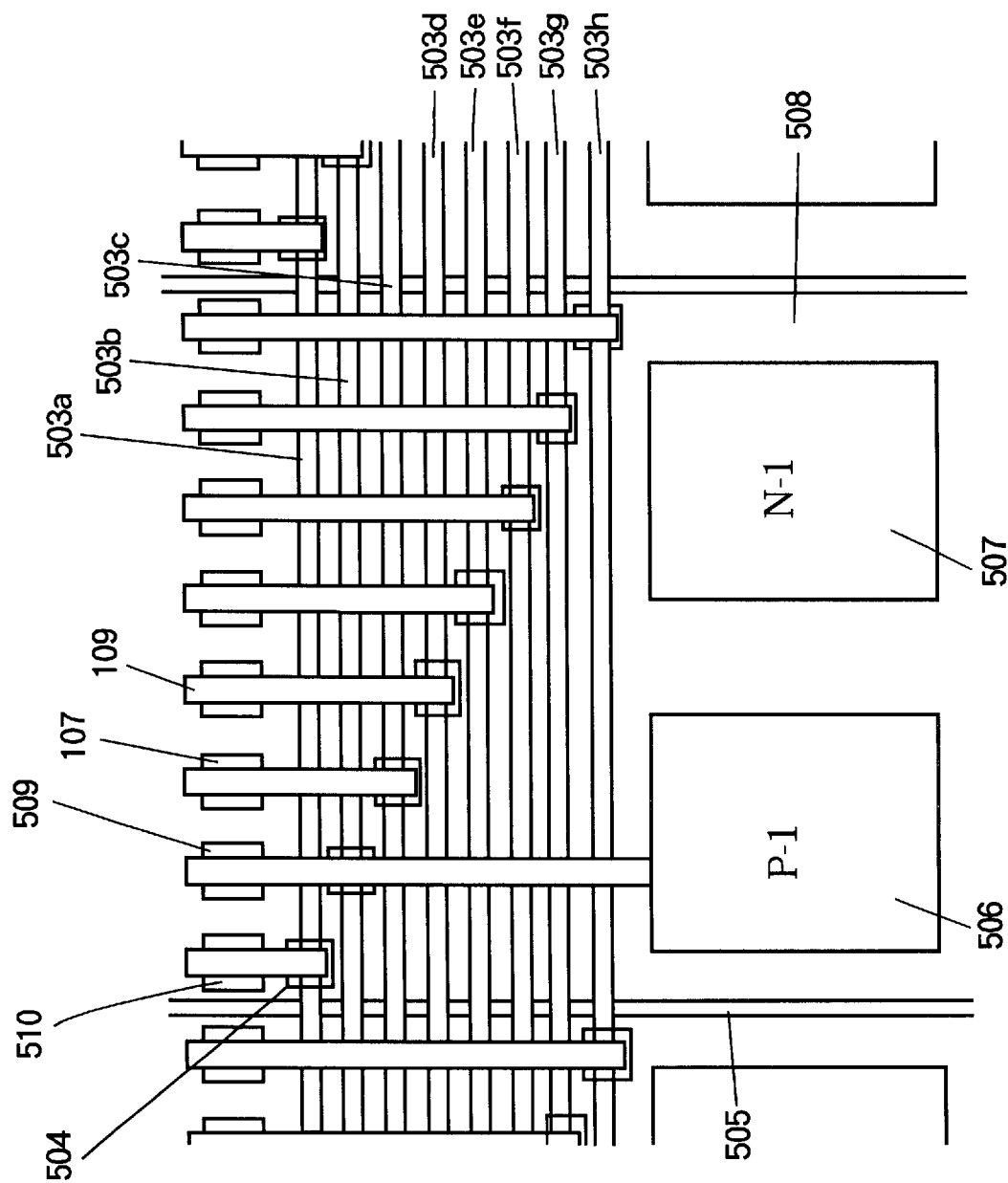
FIG. 5 is a plan view of a variation of the first embodiment, employing matrix driving.

As a variation of the first embodiment, matrix driving can be employed. FIG. 5 shows a plan view of an LED array having the sectional structure shown in FIG. 3 and operating as described above, but with the p-electrodes and n-electrodes interconnected in a matrix arrangement. The p-electrode interconnections are disposed in two separate layers, the lower layer comprising a plurality of interconnecting lines 503a to 503h running parallel to the array direction.

The semiconductor substrate 100 is divided into separate blocks 508 by isolation trenches 505 extending through the semi-insulating Gals surface layer 106, the n-type $Al_yGa_{1-y}As$ layer 104, and the semi-insulating GaAs buffer layer 102. Each block includes, for example, eight p-type diffusion regions 107, their p-electrodes 109, one p-electrode pad 506, and one n-electrode pad 507.

Each p-electrode 109 is connected to one of the p-type interconnecting lines 503a to 503h, through a contact hole 504 in an insulating layer (not visible) disposed between the p-type electrodes 109 and the interconnecting lines 503a to 503h. Each p-electrode pad 506 is also connected to one of the p-type interconnecting lines 503a to 503h. For example, the p-electrode pad P-1 shown in the drawing is connected to p-type interconnecting line 503b. It is not necessary for a p-electrode pad 506 to be present in every block 508, provided that each of the p-type interconnecting lines 503a to 503h is connected to at least one p-electrode pad. Each n-electrode pad 507 is coupled to an n-electrode 110 (not visible), or is coupled directly to an n-type diffusion region 120 (not visible) disposed directly beneath the n-electrode pad.

The light-emitting areas 509, 510 are the parts of the p-type diffusion regions 107 that are not covered by the p-electrodes 109. A particular light-emitting region is made to emit light by providing a forward voltage between the corresponding p-electrode pad 506 and n-electrode pad 507. For example, light Is emitted from light-emitting region 509 when a forward voltage is applied between p-electrode pad P-1 and n-electrode pad N-1.

The matrix driving scheme illustrated in FIG. 5 enables the LED array to be driven with fewer electrode pads than if each p-electrode 109 were to have its own electrode pad. The total number of electrode pads can be less than the number of LEDs in the array, so the electrode pads can be laid out less densely than the dot density of the array. In an LED array with one thousand two hundred dots per inch (1200 dpi), for example, in which the LEDs are disposed at intervals of 21.2 micrometers (21.2 µm), the electrode pads can be laid out at intervals of 84.8µm, equivalent to the spacing in a 300-dpi array.

As described above, the first embodiment increases the efficiency of a semiconductor light-emitting device by eliminating the pn junction from the surface layer of the semiconductor substrate 100, where nonradiative recombination tends to occur, and channeling more of the forward current through the deeper parts of the substrate, where radiative recombination is more likely.

By providing a semi-insulating layer 106 at the surface of the semiconductor substrate 100, the first embodiment also reduces the chance that a pinhole fault in the interlayer insulating film 108 might cause an electrical short circuit, thereby improving the yield of the device fabrication process.

By providing a semi-insulating GaAs buffer layer 102 and a semi-insulating substrate layer 101 below the n-type $Al_yGa_{1-y}As$ layer 104, and an n-electrode 110 on the upper surface of the device, the first embodiment also provides a structure that is suitable for matrix driving, so that the advantages of improved light-emitting efficiency and higher fabrication yields can be combined with a simplified electrode pad layout.

The combination of high light-emitting efficiency and matrix driving is particular valuable in a high-density LED array, in with the light-emitting regions are necessarily small, making high efficiency essential, and finding layout space for a separate p-electrode pad for each LED would be difficult.

Next, a second embodiment will be described.

Figure 6:
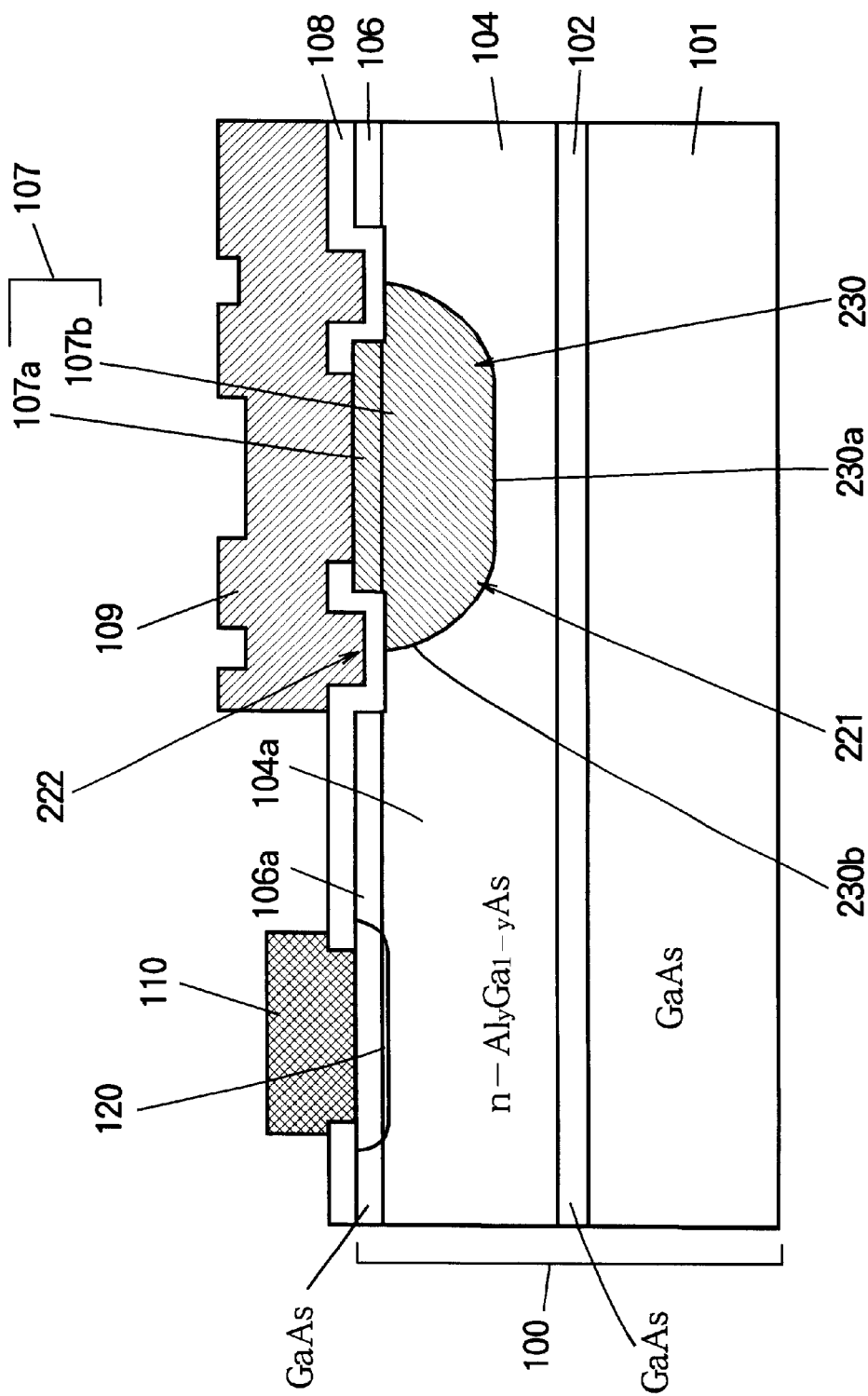
FIG. 6 is a sectional view of a light-emitting semiconductor device illustrating a second embodiment of the invention.

Referring to FIG. 6, the second embodiment adds an etched zone 222 to the structure of the first embodiment. The etched zone 222 is formed after the p-type diffusion region 107, and includes the peripheral part of the GaAs—Zn diffusion region 107a, together with a small amount of the underlying $Al_yGa_{1-y}As$—Zn diffusion region 107b. The etched zone 222 may be formed by either a dry or a wet etching process. The part of the lateral diffusion front 230b that was disposed in the GaAs surface layer 106 is completely removed. The remaining part of the GaAs—Zn diffusion region 107a is spatially separated from the n-type $Al_yGa_{1-y}As$ layer 104a, and from the pn junction 221, by the etched zone 222.

The inter-layer insulating film 108 is deposited and patterned after the etching process that forms the etched zone 222. The inter-layer insulating film 108 covers the etched zone 222, the semi-conducting GaAs surface layer 106a, and the peripheral parts of the GaAs-Zn diffusion region 107a and n-type diffusion region 120.

Figure 7:
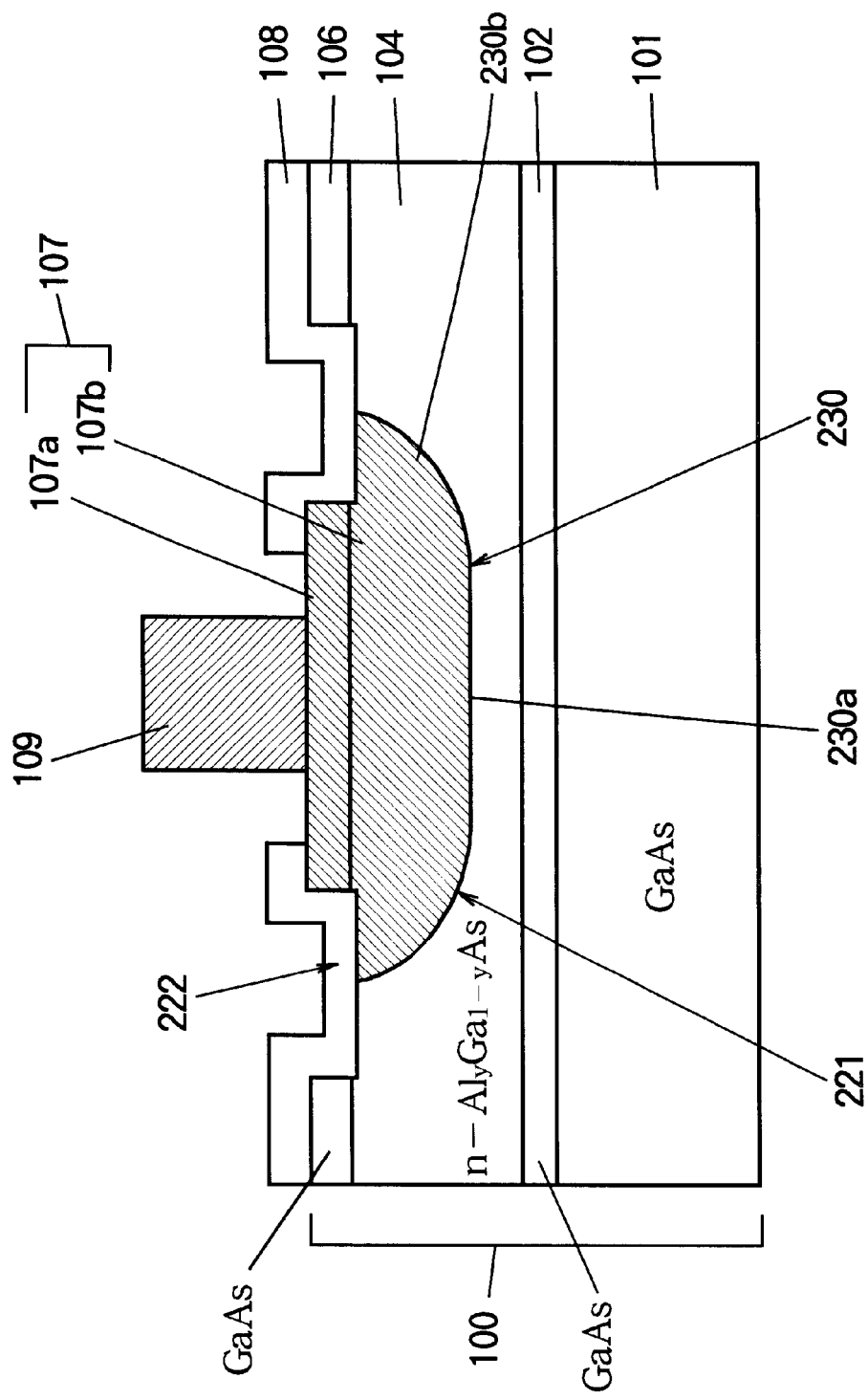
FIG. 7 is another sectional view of the second embodiment.

The other structural elements of the second embodiment are the same as in the first embodiment. A plan view of the second embodiment is identical to a plan view of the first embodiment (FIG. 4, or the variation in FIG. 5). FIG. 7 shows a sectional view of the second embodiment through line 7—7 in FIG. 4.

The operation of the second embodiment is identical to the operation of the first embodiment, so a repeated description will be omitted.

By removing the semiconductor material including the lateral diffusion front 230b from the surface layer 106, the second embodiment removes that part of the lateral diffusion front 230b that tends to have the most irregular shape, and creates the most opportunities for injection of electrons into the GaAs—Zn diffusion region 107a. In addition, the inter-layer insulating film 108 presents a physical barrier to current flow between the GaAs—Zn diffusion region 107a and the n-type $Al_yGa_{1-y}As$ layer 104a. These factors make it even more difficult than in the first embodiment for free electrons to reach the p-type GaAs—Zn diffusion region 107a, where nonradiative recombination is apt to occur.

In the first embodiment, although current could not flow from the GaAs—Zn diffusion region 107a into the semi-conducting GaAs surface layer 106a, irregular lateral diffusion could be expected to create small pn junction areas in which the GaAs—Zn diffusion region 107a was vertically adjacent to the n-type $Al_yGa_{1-y}As$ layer 104a, allowing some electrons to leak from the n-type $Al_yGa_{1-y}As$ layer 104a directly into the GaAs—Zn diffusion region 107a. In addition, some of the electrons injected into the $Al_yGa_{1-y}As$—Zn diffusion region 107b near the interface between the GaAs surface layer 106 and the $Al_yGa_{1-y}As$ layer 104 could be expected to reach the GaAs—Zn diffusion region 107a before recombining. In the second embodiment, this type of current leakage around the edges of the GaAs—Zn diffusion region 107a is substantially eliminated, the probability that electrons will reach the GaAs—Zn diffusion region 107a before recombining is reduced, the probability of nonradiative recombination is therefore reduced, and the light-emitting efficiency of the device is enhanced.

The second embodiment also provides the other advantages noted in the first embodiment. The semi-insulating GaAs surface layer 106 provides enhanced immunity from short circuits due to pinholes in the inter-layer insulating film 108 over most of the surface of the semiconductor substrate 100, and the structure of the second embodiment is suitable for matrix driving.

In a variation of the second embodiment, the etched zone 222 is enlarged to remove all of the semi-insulating GaAs surface layer 106a, as will be illustrated later.

Next, a third embodiment will be described.

Figure 8:
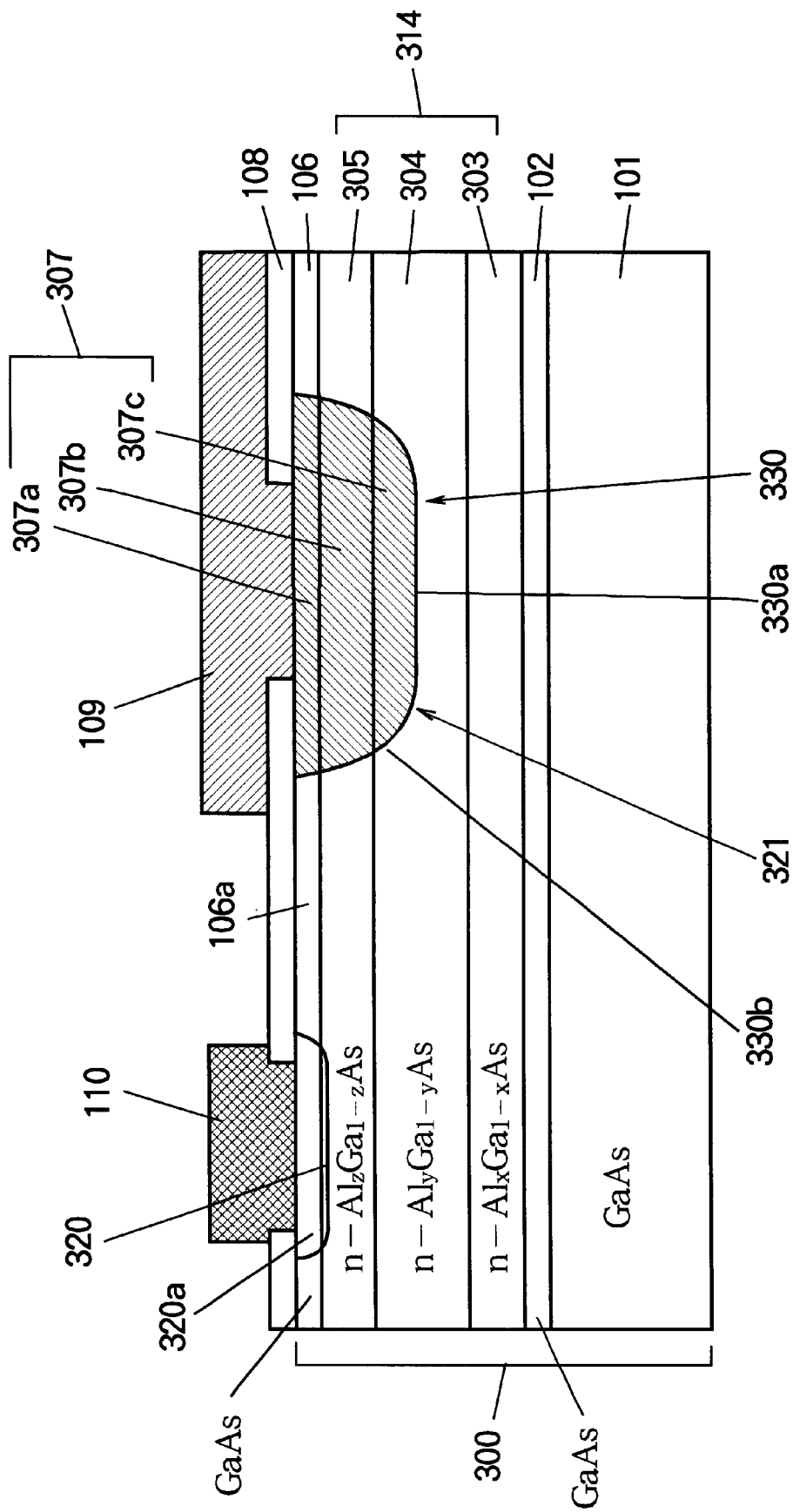
FIG. 8 is a sectional view of a light-emitting semiconductor device illustrating a third embodiment.

Referring to FIG. 8, the semiconductor substrate 300 in the third embodiment comprises the same semi-insulating GaAs substrate layer 101, semi-insulating GaAs buffer layer 102, and semi-insulating GaAs surface layer 106 as in the first embodiment. The epitaxial n-type semiconductor layer 314 disposed between the two semi-insulating epitaxial layers 102 and 106 now comprises, from bottom to top, an n-type $Al_xGa_{1-x}As$ lower cladding layer 303, an n-type $Al_yGa_{1-y}As$ light-emitting layer 304, and an n-type $Al_zGa_{1-z}As$ upper cladding layer 305, where the composition parameters x, y, z are all strictly greater than zero and equal to or less than one. The value of y is less than both x and z.

x>y and z>y

Consequently, the band-gap energies Eg(303), Eg(304), Eg(305) of the $Al_xGa_{1-x}As$ lower cladding layer 303, $Al_yGa_{1-y}As$ light-emitting layer 304, and $Al_zGa_{1-z}As$ upper cladding layer 305 are related as follows.

Eg(303)<Eg(304) and Eg(305)<Eg(304)

A p-type zinc diffusion region 307 with a diffusion front 330 is formed as in the preceding embodiments. The diffusion process is controlled so that the depthwise diffusion front 330a, and part of the lateral diffusion front 330b, is disposed in the light-emitting layer 304. The p-type diffusion region 307 thus extends through the semi-insulating GaAs surface layer 106 and upper cladding layer 305 into the light-emitting layer 304, and comprises a GaAs—Zn layer 307a, an $Al_zGa_{1-z}As$—Zn layer 307b, and an $Al_yGa_{1-y}As$—Zn layer 307c.

An n-type diffusion region 320 is formed by selective diffusion of, for example, tin or silicon. The n-type diffusion region 320 extends at least to the interface between the GaAs surface layer 106 and the upper cladding layer 305. The depthwise diffusion front of the n-type diffusion region 320 may be disposed just below the interface between the GaAs surface layer 106 and upper cladding layer 305, as shown, or at a lower level in the upper cladding layer 305.

The GaAs surface layer 106 comprises a semi-insulating layer 106a, the p-type GaAs—Zn diffusion region 307a, and an n-type diffusion region 320a. The upper cladding layer 305 comprises the p-type $Al_zGa_{1-z}As$—Zn diffusion region 307b and the adjoining n-type $Al_zGa_{1-z}As$ region. The light-emitting layer 304 comprises the p-type $Al_yGa_{1-y}As$—Zn diffusion region 307c and the adjoining an n-type $Al_yGa_{1-y}As$ region. The pn junction 321 is present only in the light-emitting layer 304 and upper cladding layer 305, and not in the GaAs surface layer 106.

An inter-layer insulating film 108, a p-electrode 109, and an n-electrode 110 are formed as in the first embodiment. The p-electrode 109 makes ohmic contact with the GaAs—Zn diffusion region 307a in the GaAs surface layer 106. The n-electrode 110 makes ohmic contact with the n-type diffusion region 320a in the GaAs surface layer 106.

The operation of the third embodiment is generally similar to the operation of the first embodiment. When a forward voltage is applied between the p-electrode 109 and n-electrode 110, forward current flows, injecting minority carriers across the pn junction 321. Substantially none of this current flows in the GaAs surface layer 106a, so relatively few electrons are injected into the GaAs—Zn diffusion region 307a. In addition, since the band-gap energy of the cladding layers 303 and 305 is greater than the band-gap energy of the light-emitting layer 304, most of the forward current is constrained to flow in the light-emitting layer 304, including the $Al_yGa_{1-y}As$—Zn diffusion region 307c. Moreover, most electrons injected into the $Al_yGa_{1-y}As$—Zn diffusion region 307c are unable to cross the energy barrier between the $Al_yGa_{1-y}As$—Zn diffusion region 307c and the $Al_zGa_{1-z}As$—Zn diffusion region 307b, and must recombine with holes in the $Al_yGa_{1-y}As$—Zn diffusion region 307c, rather than in higher layers. Similarly, holes injected into the n-type $Al_yGa_{1-y}As$ layer 304 are confined by or the energy barrier between this layer 304 and the upper cladding layer 305, and the energy barrier between the $Al_yGa_{1-y}As$ layer 304 and the lower cladding layer 303, and therefore recombine with electrons in the $Al_yGa_{1-y}As$ layer 304.

Due to the carrier confinement, substantially all light emission takes place In the $Al_yGa_{1-y}As$ layer 304, the wavelength of the emitted light being controlled by the parameter y. Since the band-gap energy of the $Al_yGa_{1-y}As$ layer 304 is less than the band-gap energy of the upper cladding layer 305, the light emitted in the $Al_yGa_{1-y}As$ layer 304 is not absorbed in the upper cladding layer 305. Some absorption takes place in the GaAs surface layer 106, but as noted in the first embodiment, the GaAs surface layer 106 is thin (500 Å, for example), so the absorption is slight. Except for light reflected by the p-electrode 109, most of the light that enters the GaAs surface layer 106 is emitted to the outside.

Compared with the first embodiment, less carrier recombination occurs near the surface in the third embodiment, so nonradiative recombination is further reduced, and the efficiency of light emission is further improved.

The third embodiment retains the other advantages pointed out in the first embodiment: enhanced immunity to short circuits caused by pinholes, and a structure suitable for matrix driving.

In a variation of the third embodiment, one of the two cladding layers, either the lower cladding layer 303 or the upper cladding layer 305, is omitted.

Next, a fourth embodiment will be described. The fourth embodiment combines the features of the second and third embodiments.

Figure 9:
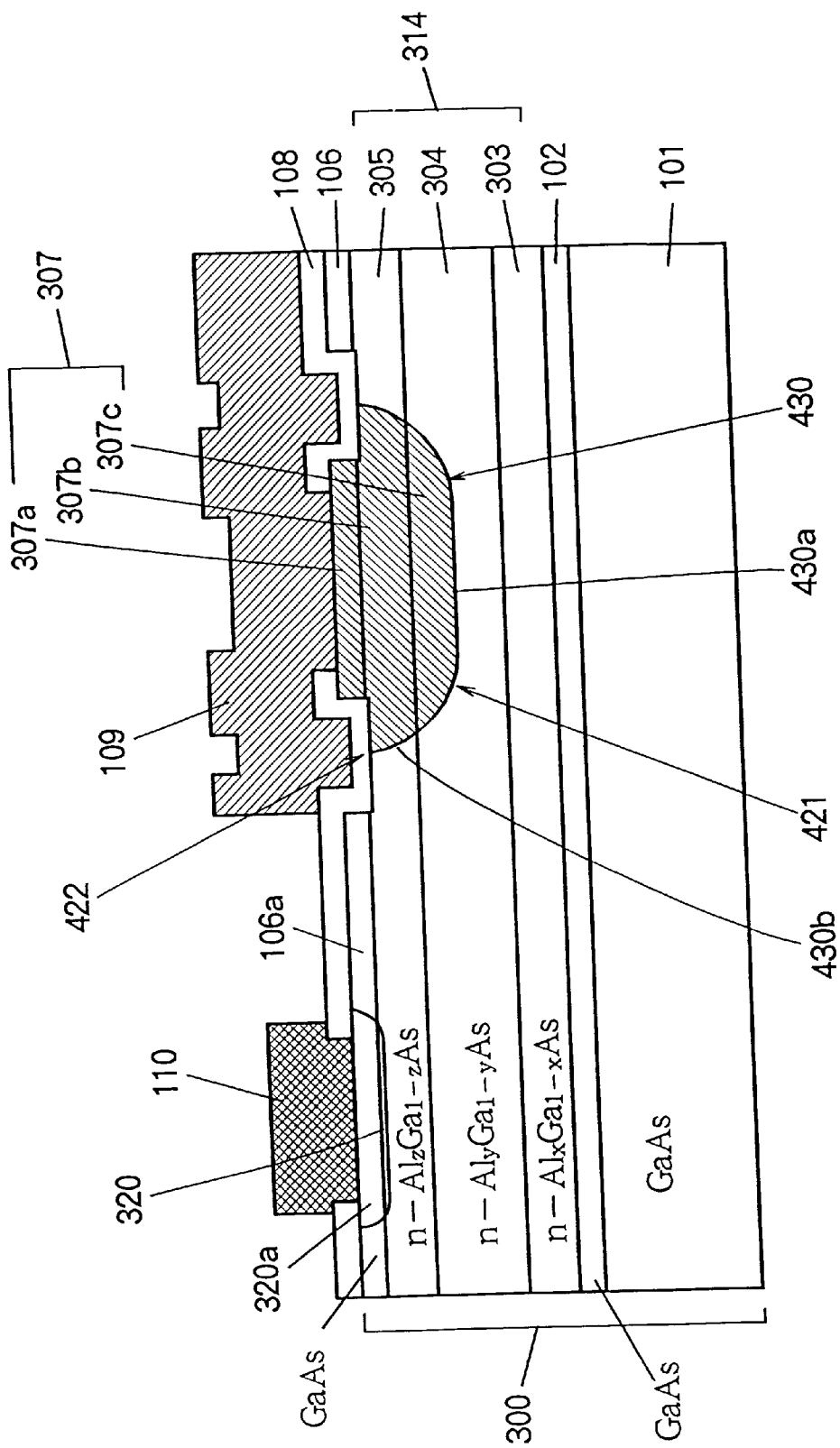
FIG. 9 is a sectional view of a light-emitting semiconductor device illustrating a fourth embodiment.

Referring to FIG. 9, the fourth embodiment has the same semiconductor substrate 300 as in the third embodiment, and the same p-type diffusion region 307, n-type diffusion region 320, inter-layer insulating film 108, p-electrode 109, and n-electrode 110. Differing from the third embodiment, the GaAs surface layer 106 is removed by etching around the periphery of the p-type diffusion region 307, the removed material including the diffusion front 430b of the GaAs—Zn diffusion region 307a and the adjacent interface between the GaAs surface layer 106 and the $Al_zGa_{1-z}As$ upper cladding layer 305, substantially as in the second embodiment. The etched zone 422 is filled in by the inter-layer insulating film 108, which extends over the remaining edges of the GaAs—Zn diffusion region 307a.

Figure 10:
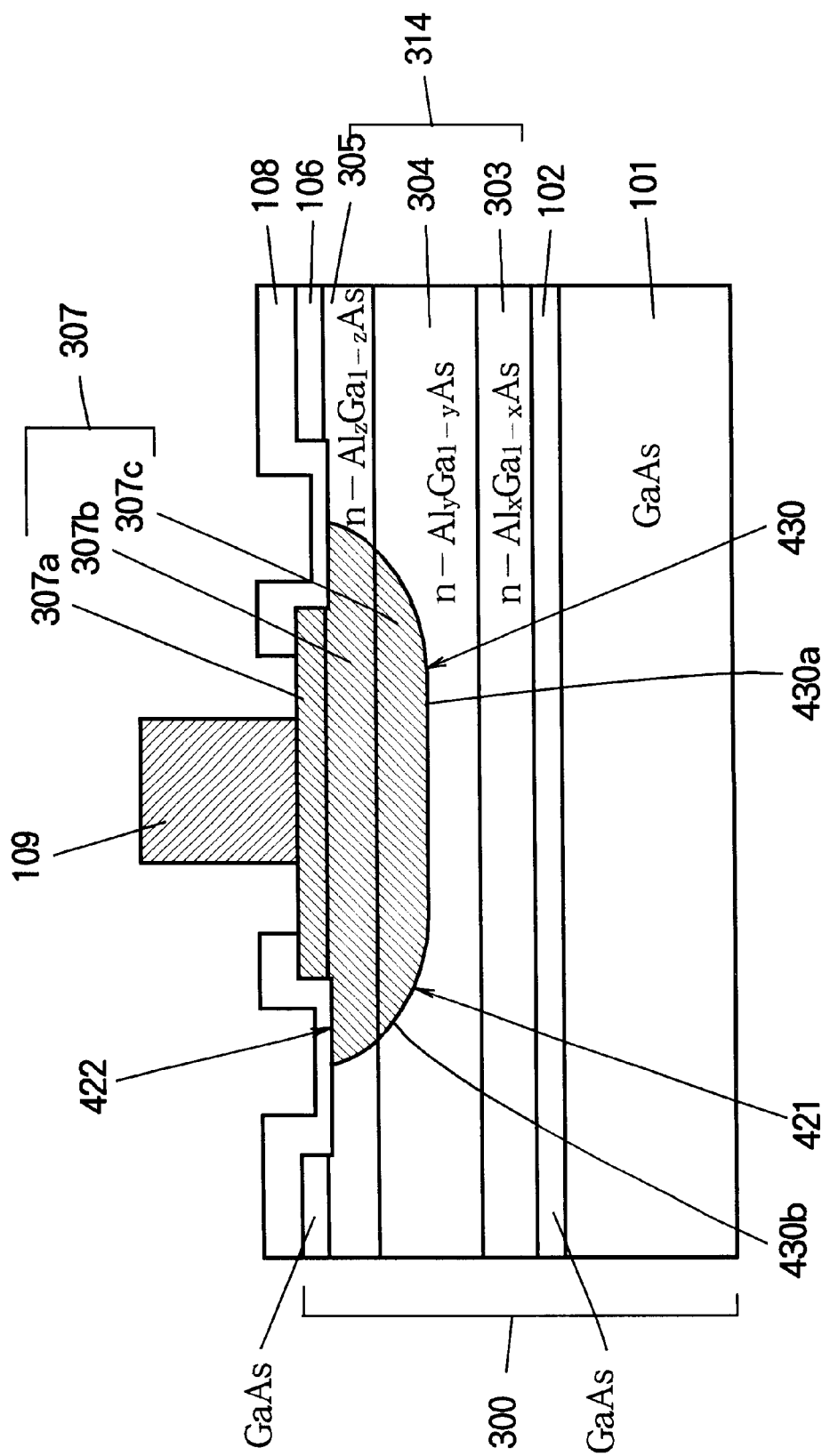
FIG. 10 is another sectional view of the fourth embodiment.

In plan view, the fourth embodiment has the same array layout as in the preceding embodiments, shown in FIG. 4 or FIG. 5. FIG. 10 shows a sectional view of the fourth embodiment through line 7—7 in FIG. 4.

The fourth embodiment provides the combined effects of the second and third embodiments. Injection of electrons into the GaAs—Zn diffusion region 307a is very effectively prevented by the etched zone 422 and the inter-layer insulating film 108. Lateral flow of forward current is largely confined to the light-emitting layer 304, including the $Al_yGa_{1-y}As$—Zn diffusion region 307c. The recombination of minority carriers with majority carriers is constrained to take place almost entirely in this layer. Nonradiative recombination is reduced even more than in the preceding embodiments. In addition, the semi-insulating GaAs surface layer 106a provides immunity from pinhole short circuits, and the device has a structure suitable for matrix driving.

Figure 11:
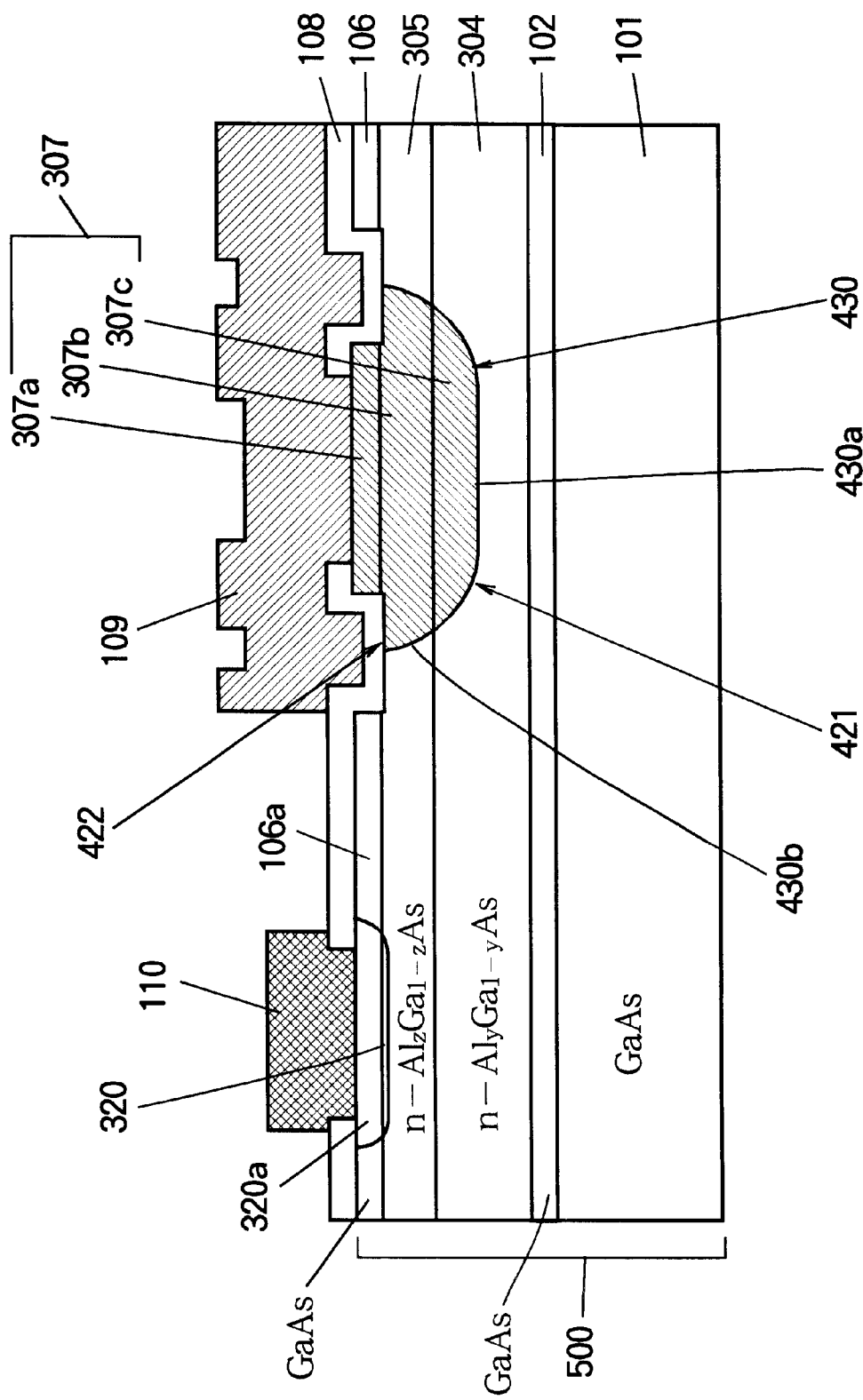
FIG. 11 is a sectional view of a variation of the fourth embodiment.

FIG. 11 illustrates a variation of the fourth embodiment in which the lower cladding layer is eliminated, the light-emitting layer 304 being grown directly on the semi-insulating GaAs buffer layer 102. To this extent, the semiconductor substrate 500 in this variation of the fourth embodiment is more easily fabricated than the semiconductor substrate 300 in FIG. 9. Substantially the same effects are obtained, the band-gap energy barrier between the light-emitting layer 304 and upper cladding layer 305 causing most carrier recombination to take place in the light-emitting layer 304, including the $Al_yGa_{1-y}As$—Zn diffusion region 307c.

Figure 12:
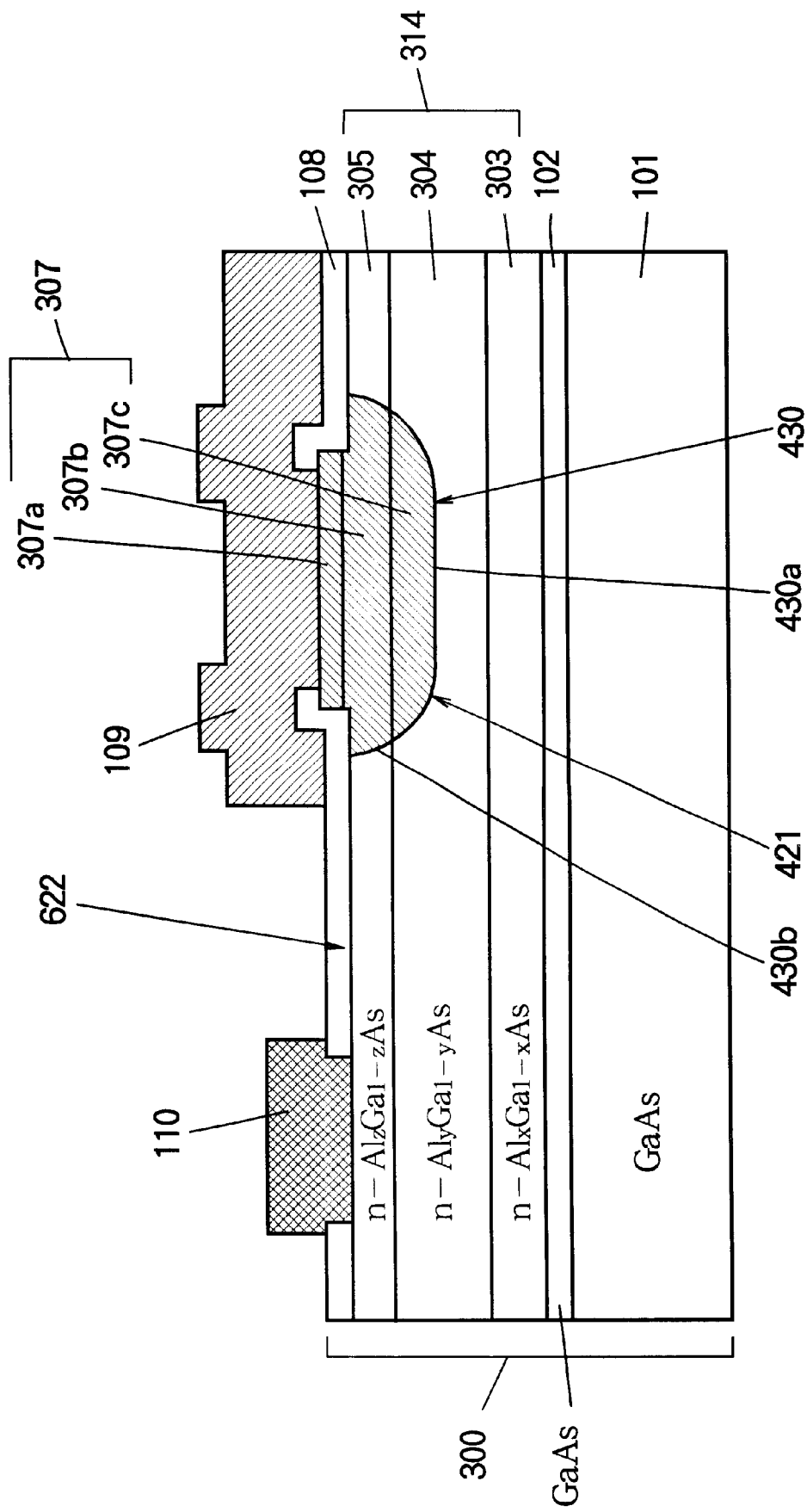
FIG. 12 is a sectional view of another variation of the fourth embodiment.

FIG. 12 illustrates another variation of the fourth embodiment, in which the etched zone 622 is enlarged to include the entire GaAs surface layer 106, except for the GaAs—Zn diffusion region 307a, which is left as an etched island. In this variation, no n-type diffusion region is formed, so an n-type diffusion step can be eliminated from the fabrication process. For formation of an ohmic contact between the n-electrode 110 and the $Al_zGa_{1-z}As$ upper cladding layer 305, the aluminum composition ratio (z) in the $Al_zGa_{1-z}As$ upper cladding layer 305 should be strictly between 0.4 and 1.0.

The embodiments above used AlGaAs as an n-type semiconductor material, but the invention can be practiced with other conductive semiconductor materials, such as indium gallium arsenide (InGaAs), indium gallium phosphide (InGaP), indium aluminum phosphide (InAlP), indium gallium arsenide phosphide (InGaAsP), gallium aluminum arsenide phosphide (GaAlAsP), indium gallium aluminum phosphide (InGaAlP), or gallium arsenide phosphide (GaAsP).

The n-electrode and n-type diffusion region can be disposed in any convenient position on the same surface of the device as the p-electrode, not necessarily close to the p-type diffusion region as shown in the drawings. The location of the n-electrode can be chosen so as to minimize the device size.

Those skilled in the art will recognize that further variations are possible within the scope claimed below.

What is claimed is:

1. A light-emitting semiconductor device, comprising:
   a conductive semiconductor layer of a first conductive type;
   a semi-insulating semiconductor surface layer formed on said conductive semiconductor layer;
   a first diffusion region, of a second conductive type opposite to said first conductive type, extending through said semi-insulating semiconductor surface layer into said conductive semiconductor layer, having a depthwise diffusion front ending in said conductive semiconductor layer;
   a second diffusion region of said first conductive type, extending through said semi-insulating semiconductor surface layer at least to an interface between said semi-insulating semiconductor surface layer and said conductive semiconductor layer;
   a first electrode forming an ohmic contact with said first diffusion region; and
   a second electrode forming an ohmic contact with said second diffusion region.

2. The light-emitting semiconductor device of claim 1, wherein:
   said semi-insulating semiconductor surface layer comprises gallium arsenide;
   said conductive semiconductor layer comprises aluminum gallium arsenide; and
   said first diffusion region comprises a zinc impurity.

3. The light-emitting semiconductor device of claim 1, wherein said conductive semiconductor layer further comprises:
   a light-emitting layer including the depthwise diffusion front of said first diffusion region; and
   a cladding layer disposed between said light-emitting layer and said semi-insulating semiconductor surface layer.

4. The light-emitting semiconductor device of claim 3, wherein:
   said light-emitting layer comprises aluminum gallium arsenide;
   said cladding layer comprises aluminum gallium arsenide with a higher concentration of aluminum than in said light-emitting layer; and
   said first diffusion region comprises a zinc impurity.

5. The light-emitting semiconductor device of claim 1, wherein said conductive semiconductor layer further comprises:
   a cladding layer; and
   a light-emitting layer disposed between said cladding layer and said semi-insulating semiconductor surface layer, including the depthwise diffusion front of said first diffusion region.

6. The light-emitting semiconductor device of claim 5, wherein:
   said light-emitting layer comprises aluminum gallium arsenide;
   said cladding layer comprises aluminum gallium arsenide with a higher concentration of aluminum than in said light-emitting layer; and
   said first diffusion region comprises a zinc impurity.

7. The light-emitting semiconductor device of claim 1, wherein said conductive semiconductor layer further comprises:
   a light-emitting layer including the depthwise diffusion front of said first diffusion region;
   a first cladding layer disposed adjacently above said light-emitting layer; and
   a second cladding layer disposed adjacently below said light-emitting layer.

8. The light-emitting semiconductor device of claim 7, wherein:
   said light-emitting layer comprises aluminum gallium arsenide;
   said first cladding layer and said second cladding layer comprise aluminum gallium arsenide with a higher concentration of aluminum than in said light-emitting layer; and
   said first diffusion region comprises a zinc impurity.

9. The light-emitting semiconductor device of claim 1, wherein a portion of said semi-insulating semiconductor surface layer, including a lateral diffusion front of said first diffusion region, is removed by etching.

10. The light-emitting semiconductor device of claim 9, wherein a portion of an interface between said conductive semiconductor layer and the removed portion of said semi-insulating semiconductor surface layer is also removed by etching.

11. The light-emitting semiconductor device of claim 1, further comprising a semi-insulating semiconductor substrate layer, said conductive semiconductor layer being disposed between said semi-insulating semiconductor surface layer and said semi-insulating semiconductor substrate layer.

12. A light-emitting semiconductor array device comprising a matrix-driven plurality of light-emitting semiconductor devices as described in claim 11, the light-emitting semiconductor devices sharing said semi-insulating semiconductor substrate layer.

13. A light-emitting semiconductor device having an upper surface, comprising:
   a conductive semiconductor layer of a first conductive type;
   an etched island formed by etching a semi-insulating semiconductor surface layer formed on said conductive semiconductor layer;

a diffusion region, of a second conductive type opposite to said first conductive type, formed before said semi-insulating semiconductor surface layer is etched, including said etched island, having a depthwise diffusion front ending in said conductive semiconductor layer;

a first electrode disposed on said upper surface, forming an ohmic contact with said etched island; and a second electrode disposed on said upper surface, forming an ohmic contact with said conductive semiconductor layer outside said diffusion region.

14. The light-emitting semiconductor device of claim 13, wherein said conductive semiconductor layer further comprises:

a light-emitting layer including the depthwise diffusion front of said diffusion region; and a first cladding layer disposed above said light-emitting layer, said second electrode making ohmic contact with said first cladding layer.

15. The light-emitting semiconductor device of claim 14, wherein:

said light-emitting layer comprises aluminum gallium arsenide;

said first cladding layer comprises aluminum gallium arsenide with a higher concentration of aluminum than in said light-emitting layer; and said diffusion region comprises a zinc impurity.

16. The light-emitting semiconductor device of claim 14, wherein said conductive semiconductor layer further comprises a second cladding layer, disposed below said light-emitting layer.

17. The light-emitting semiconductor device of claim 16, wherein:

said light-emitting layer comprises aluminum gallium arsenide;

said first cladding layer and said second cladding layer comprise aluminum gallium arsenide with a higher concentration of aluminum than in said light-emitting layer; and said diffusion region comprises a zinc impurity.

18. The light-emitting semiconductor device of claim 13, further comprising a semi-insulating semiconductor substrate layer disposed below said conductive semiconductor layer.

19. A light-emitting semiconductor array device comprising a matrix-driven plurality of light-emitting semiconductor devices as described in claim 18, the light-emitting semiconductor devices sharing said semi-insulating semiconductor substrate layer.

* * * * *

UNITED STATES PATENT AND TRADEMARK OFFICE
CERTIFICATE OF CORRECTION

PATENT NO.   : 6,313,483 B1                                                                            Page 1 of 1
DATED        : November 6, 2001
INVENTOR(S)  : Mitsuhiko Ogihara, Hiroshi Hamano and Masumi Taninaka It is certified that error appears in the above-identified patent and that said Letters Patent is hereby corrected as shown below:

<u>Title page,</u>
Item [73], should read as follows:

-- [73] Assignee: Oki Data Corporation, Tokyo (JP) --

Signed and Sealed this

Sixth Day of August, 2002

*Attest:*

JAMES E. ROGAN
*Attesting Officer*      *Director of the United States Patent and Trademark Office*